United States Patent [19]
Mills et al.

[11] Patent Number: 5,796,593
[45] Date of Patent: Aug. 18, 1998

[54] PLANAR MOUNTS CAPABLE OF MOUNTING PLANARS OF VARYING THICKNESS

[75] Inventors: R. Steven Mills, Austin; Randall T. Smith, Georgetown, both of Tex.

[73] Assignee: Dell USA, L.P., Round Rock, Tex.

[21] Appl. No.: 591,098

[22] Filed: Jan. 25, 1996

[51] Int. Cl.$^6$ ............................................. H05K 7/14
[52] U.S. Cl. ...................... 361/801; 361/740; 361/741; 361/747; 361/752; 361/753; 361/759; 361/796; 361/799; 361/800; 361/802; 211/41.17; 439/64
[58] Field of Search ........................ 361/726, 732, 361/737, 740, 741, 742, 747, 752, 753, 758, 759, 796, 799, 800, 801, 802, 807, 809; 312/223.1, 223.2, 223.6; 211/41.17; 439/64, 377

[56] References Cited

U.S. PATENT DOCUMENTS

| | | | |
|---|---|---|---|
| 4,649,461 | 3/1987 | Matsuda | 361/799 |
| 5,452,184 | 9/1995 | Scholder et al. | 361/799 |
| 5,563,770 | 10/1996 | Bethurum | 361/737 |

*Primary Examiner*—Leo P. Picard
*Assistant Examiner*—Phuong T. Vu
*Attorney, Agent, or Firm*—Skjerven, Morrill, MacPherson, Franklin & Friel, L.L.P.; Stephen A. Terrile

[57] ABSTRACT

The present invention provides, for use in a chassis configured to alternatively house first or second planar boards hating different thicknesses and daughter board side surfaces, a universal planar mount for supporting the planar board within the chassis. The universal planar may consist of a planar support coupled to a wall of the chassis that has first and second shoulders, preferably more than two, associated therewith that may be stair-stepped with respect to each other. The planar support may consist of a plurality of planar supports. In another aspect, the shoulders are formed in opposite side edges of the support walls. The first shoulder is engagable with the first planar board to mount the daughter board side surface of the first planar board a predetermined distance from the wall. Alternatively, the second shoulder is engagable with the second planar board to mount the daughter board side surface of the second planar board the same predetermined distance from the wall, thereby allowing either of the first or second planar boards to be used in the same chassis without modification to the chassis or accessory parts, such as the daughter boards.

42 Claims, 2 Drawing Sheets

PLANAR MOUNTS CAPABLE OF MOUNTING PLANARS OF VARYING THICKNESS

TECHNICAL FIELD OF THE INVENTION

The present invention is directed, in general, to planar mounts for use in a chassis and, more specifically, to planar member mounts capable of mounting planars of varying thickness within a computer chassis.

BACKGROUND OF THE INVENTION

Generally, electronics chassis for computers are designed to support planars of a certain thickness. This is because many of the other parts such as risers, option cards, and the input/output "I/O" area, are dependent on the location of the top surface of the planar. Thus, the manufacturing process for the chassis is designed such that these parts are properly located with respect to the chassis when the chassis's manufacture is complete.

The manufacturing process for personal computers ("PCs") in particular, is at least a three-step process depending, in large part, on the final desired shape of the chassis. The manner in which the chassis is to be secured to its environment, and the manner in which electronic components are to be secured within the chassis are important considerations of the manufacturing process.

Manufacture of a typical chassis (generally a box-like structure) begins by stamping parts of the chassis out of sheet metal with a die press. The stamping step yields one or more flat sheets of metal having a desired geometry. The flat sheets are then bent or folded to form portions of the finished chassis. In the bending step, various edges of the flat sheet are brought into proximity with one another to form edges and corners of the chassis portions. The edges or corners may be spot welded, soldered or brazed together to create a permanent bond. Finally, screws or other removable fasteners may be used removably to join the chassis portions together to form a rigid, mechanically sturdy chassis, to form a barrier against electromagnetic interference ("EMI") emanating from the components in the chassis, to shield the components from stray EMI from without the chassis and to form good electrical conductivity in the chassis for grounding purposes.

As part of this conventional stamping step, a plurality of hooks are formed on the chassis floor, or alternatively, on a planar plate that lies on the chassis floor just beneath the planar. These hooks are bent upward in the subsequent bending step and are arranged to provide a channel for capturing opposing sides of the planar, such as a motherboard, allowing the planar to slide only in the direction of the channel. Unfortunately, however, these prior art hooks can only accommodate a given thickness of planar, and if a planar having a different thickness is used, the additional thickness of the planar requires either that the chassis be redesigned to accommodate this variation in thickness or that the other parts such as risers, option cards, and the input/output "I/O" area are compensated so that they will properly align when placed in the chassis. In either these steps add to manufacturing time and cost.

The thickness of the planar board varies from one model type of computer to another. As computer speeds have greatly expanded, it has become desirable to incorporate multiple circuit layers into the planars or motherboards within the chassis to achieve a high degree of electrical component density. Multiple layers of circuits within a planar allow application of more electrical components within the chassis, thereby providing more computing power for the user. The number of circuit layers within the planar, and thus the planar thickness, varies from one computer model to another. Unfortunately, however, varying the thickness of the planar in a chassis using conventional hooks causes the location of the planar's top surface to change with respect to the original chassis design as previously mentioned. When the planar's top surface changes, other items, such as daughter boards, option cards, and the input/output "I/O" area accessories need to be adjusted to compensate for the variation in thickness.

Accordingly, there is a need in the art for a planar mount in a chassis that is capable of mounting planars having varying thickness without changing the position of the planar top surface with respect to the chassis from one planar thickness to another. The present invention provides a mounting system that addresses these needs.

SUMMARY OF THE INVENTION

To address the above-discussed deficiencies of the prior art, the present invention provides for use in a chassis configured to alternatively house first or second planar boards having different thicknesses and daughter board side surfaces, a universal planar mount for supporting the planar board within the chassis. In a preferred embodiment, the universal planar is a planar support coupled to a wall of the chassis that has first and second shoulders, preferably more than two, associated therewith that are preferably stair-stepped with respect to each other. Preferably, the planar support is a plurality of planar supports. In another aspect, the shoulders are formed in opposite side edges of the support walls.

The first shoulder is engagable with the first planar board to mount the daughter board side surface of the first planar board a predetermined distance from the wall. Alternatively, the second shoulder is engagable with the second planar board to mount the daughter board side surface of the second planar board the same predetermined distance from the wall.

Thus, the present invention provides the distinct advantage of providing a planar mount that accommodates either a first planar board with a certain thickness or a second planar board having a thickness different from that of the first planar board while maintaining the daughter board side surfaces of either of the boards the same predetermined distance from the wall of the chassis. This allows the manufacturer to use the same chassis for either planar board without the necessity of adjusting the chassis or other components to that particular planar boards thickness. Moreover, since the planar support is coupled to the wall of the chassis, the planar support forms an EMI path from the first or second planar boards to the chassis.

In a preferred embodiment, the planar support has a first end coupled to the wall and a second end extending inwardly from the wall and further is a hook member coupled to the second end of the planar support that extends outwardly from and transverse to the planar support. The hook member is configured to be received through a retaining slot formed in the first and second planar boards. Preferably, the hook member is configured to apply a predetermined preload pressure to the first or second planar boards. Generally, during the die-stamping process typically used to form the hook member, the hook member will be cantilevered with respect to the planar support to the degree necessary to cause the predetermined preload pressure on the planar board. The advantage in this aspect is that the hook member helps to hold the planar board firmly in place and prevents vibration of the board during transit or use.

More preferably however, the hook member includes a concave projection formed in it end that extends away from the planar support. The projection is configured to contact the daughter board side surface of the first or second planar boards to thereby apply the predetermined preload pressure. Thus, the projection can be used in conjunction with the hook member to further define and control the amount of preload pressure exerted against the planar board.

In another aspect of the present invention, the planar support may be a substantially flat wall member that is integrally formed with the wall of the chassis. Preferably, the wall member is die-stamped from the wall of the chassis. In yet another aspect, the wall member is integrally formed with a planar plate that is, in turn, coupled to the wall of the chassis. The advantage in using a planar plate is that EMI is reduced because the opening formed in the plate when the planar supports are formed are covered by the wall of the chassis. Preferably, the planar support is die-stamped from the planar plate.

In another embodiment of the present invention, there is provided a universal planar mount system. The system preferably is a computer chassis having a wall for mounting a planar board thereto and configured to alternatively house first or second planar boards having different thicknesses and daughter board side surfaces. The universal planar mount system further includes a planar support coupled to the wall of the chassis and has first and second shoulders, preferably more than two, associated therewith. The shoulders are preferably formed in opposite side edges of the support walls and are preferably stair-stepped. The planar support further has a first end coupled to the wall and a second end that extends inwardly from the wall. The first shoulder is engagable with a surface of the first planar board to mount the daughter board side surface of the first planar board a predetermined distance from the wall. The second shoulder is engagable with a surface of the second planar board to mount the daughter board side surface of the second planar board the predetermined distance from the wall. The planar support can accommodate either the first or second planar boards of different thickness while maintaining the daughter board side surface at the predetermined distance. Additionally, this embodiment includes a hook member coupled to the second end of the planar support that extends outwardly from and transverse to the planar support. The hook member is configured to be received through a retaining slot formed in the first and second planar boards.

In a preferred embodiment, the planar mount system further includes a planar board wherein the planar board is 1) a first planar board having a retaining slot formed therein and a support surface on opposite sides of the retaining slot, the support surfaces engaging the first shoulder to thereby support the daughter side surface of the first planar board the predetermined distance from the wall or 2) a second planar board having a retaining slot formed therein and a support surface on opposite sides of the retaining slot, the support surfaces engaging the second shoulder to thereby support the daughter side surface of the second planar board the predetermined distance from the wall.

Preferably, the hook is configured to apply a predetermined preload pressure to the first or second planar boards. More preferably, however, the hook member includes a projection formed therein for contacting the daughter board side surface of the first or second planar boards and applying the predetermined preload pressure against the selected planar board.

In one aspect of this particular embodiment, the planar support is a substantially flat wall member that is integrally formed with the wall of the chassis. In such instances, it is preferable that the planar member is die-stamped from the wall of the chassis. In another embodiment, however, the planar member is integrally formed with a planar plate coupled to the wall of the chassis, and in such instances, it is preferably that the planar member is die-stamped from the planar plate.

The planar mount system combines with the chassis structure to form an EMI path from the first or second planar boards to the chassis, which has the distinct advantage of achieving an EMI ground without the necessity of incorporating additional parts into the chassis for EMI purposes.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
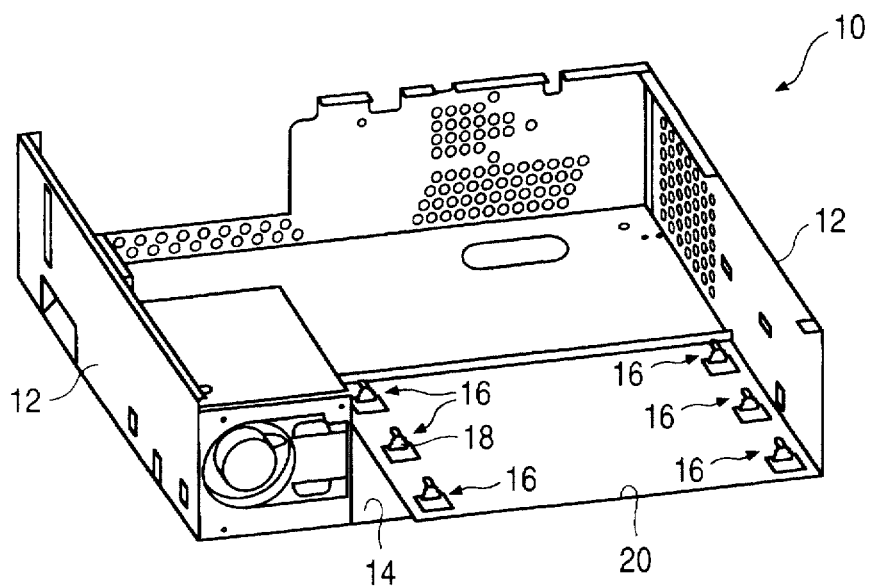
FIG. 1 illustrates an isometric view of an uncovered chassis with planar mounts coupled to the mounting wall.

Referring initially to FIG. 1, there is illustrated, in a preferred embodiment, a chassis 10, preferably a computer chassis, having side walls 12 and a mounting wall 14, which is designed to support a motherboard (not shown). The chassis 10 is preferably constructed in a conventional manner using die-stamping and metal bending techniques to form and shape the side walls 12 and mounting wall 14 and is configured to house a planar board and other electrical components (not shown) therein.

Coupled to the mounting wall 14 is a planar mount 16 of the present invention. In a preferred embodiment, there are a plurality of such planar mounts coupled to the chassis' mounting wall 14. Each planar mount 16 is a planar support 18, which is discussed in more detail below, coupled to the mounting wall 14. The plurality of planar supports 16 are positioned on the mounting wall 14 in a configuration that is intended to engage a planar board (not shown) at multiple locations to securely hold the planar board on the mounting wall 14. The planar supports 18 may take on a variety of configurations and may be coupled to the mounting wall 14 in numerous ways. For example, the planar supports 18 may be individual planar supports that are separately coupled to the mounting wall 14 or a planar plate 20 (e.g. a sub-plate that lies over a portion of the mounting wall 14). Alternatively, the planar supports 18 may be die-stamped from the mounting wall 14 or the planar plate 20.

Figure 2:
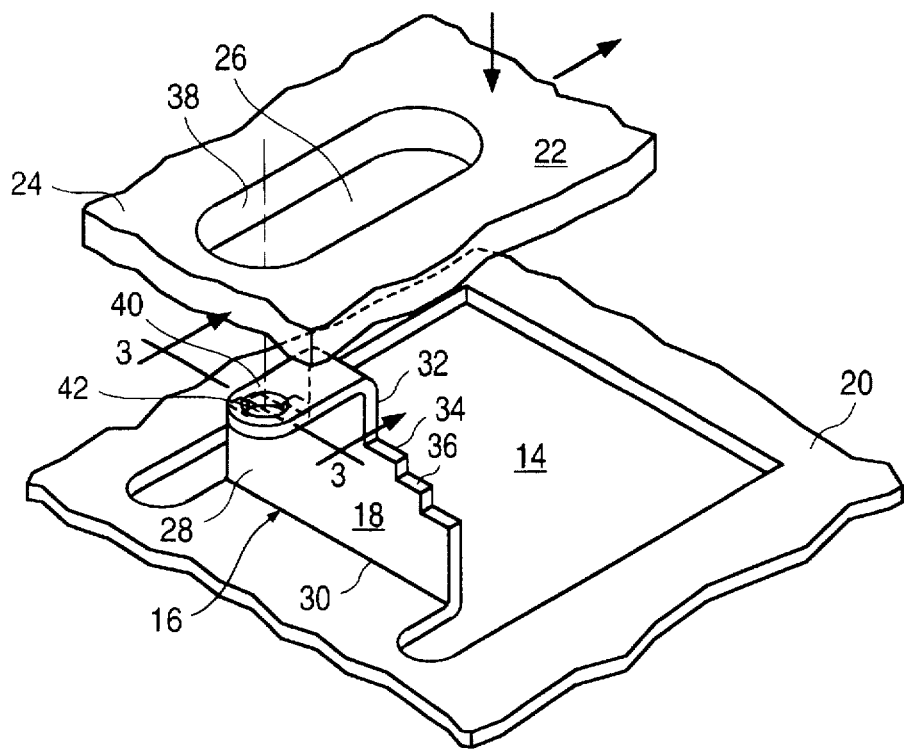
FIG. 2 illustrates an enlarged, isometric partial view of a planar mount with a planar that has a retaining slot formed therein and that is exploded from the planar mount.

Turning now to FIG. 2, there is illustrated an enlarged, exploded view of the planar mount 16 with a planar board 22 having a daughter board side surface 24, i.e. the surface of the planar board 22 to which daughter boards are typically connected. In most chassis designs, the planar board 22 is preferably a conventional motherboard composed of dielectric materials with multiple layers of electrical circuits incorporated therebetween. The daughter board side surface 24 of the planar board 22 includes conventional electrical sockets (not shown) configured to receive a daughter board (not shown) therein. As shown in a preferred embodiment, the planar board 22 includes a retaining slot 26 formed through the planar board 22. More preferably, however, the planar board 22 includes a plurality of such retaining slots that are spaced-apart at various locations in the planar board 22, such as along the edges and the ends of the planar board 22. It will, of course, be appreciated by those skilled in the art that the edges or side of the planar board 22 may have an alternative design, such as notches formed therein, that allow varying thicknesses of planar boards to cooperatively engage and be supported by the planar mounts 16. As seen by the foregoing, the present invention provides a mounting system that accommodates planar boards having thicknesses that differ from one another. The distinct advantage of providing a such a system is that it provides a planar mount that can accommodate either a first planar board with a certain thickness or a second planar board having a thickness different from that of the first planar board while maintaining the daughter board side surfaces of either of the boards the same predetermined distance from the mounting wall 14 of the chassis 10 (FIG. 1). This allows the manufacturer to use the same chassis for either planar board without the necessity of adjusting the chassis or other components to that particular planar boards thickness.

Continuing to refer to FIG. 2, the planar mount 16, as previously stated, is the planar support 18 coupled to the mounting wall 14 of the chassis 10. The planar support 18 preferably is a substantially flat metallic wall member 28 that is integrally formed with the mounting wall 14 of the chassis 10 (FIG. 1) and that has a first end 30 coupled to the mounting wall 14 and a second end 32 extending inwardly from the mounting wall 14. In a preferred embodiment, the planar support 18 is die-stamped by conventional processes from either the mounting wall 14 or the planar plate 20 and then bent to the appropriate configuration and position. However, in an alternative embodiment, the planar support 18 may be individually coupled to the mounting wall 14 or the planar plate 20. The planar support 18, in a preferred embodiment, has first and second shoulders 34,36 associated therewith. Preferably, the first and second shoulders 34,36 are stair-stepped and formed as opposing pairs of shoulders as illustrated in FIG. 2. In those embodiments where the planar support 18 is comprised of metal, the planar support 18 forms an EMI path from the planar board 22 to the chassis 10 (FIG. 1).

The first shoulder 34 is configured to engage a planar board having a retaining slot with a width sufficient to allow the planar board to be supported on the first shoulder 34; that is an edge 38 of the retaining slot 26 engages and supportively rests on the first shoulder 34. The retaining slot 26 may have a number of configurations. For example, the retaining slot 26 may have an oval shape as illustrated in FIG. 2.

Alternatively, the retaining slot 26 may simply be notches formed in the edges of the ends and sides of the planar board 22. In any embodiment, however, it is important that the retaining slot 26 allow the planar board 22 to be supported by one pair of the first or second shoulders 34,36.

The second shoulder 36 is configured to engage a planar board wherein the retaining slot has a width that is sufficient to allow the planar board to be supported on the second shoulder 36. Of course, it will be appreciated by those of ordinary skill in the art that the planar support 18 may have more support shoulders than the first and second shoulders 34,36 just discussed.

In an additional preferred embodiment, the planar support 18 is a hook member 40 coupled to the second end 32 of the planar support 18. The hook member 40 extends outwardly from and transverse to the planar support 18 and is configured to be received through the retaining slot 26 formed in the planar board 22. In a preferred embodiment, the hook member 18 is cantilevered to apply a predetermined preload pressure to the planar board 22, which allows the planar support 18 to hold the planar board 22 in a correct position. It is known in the art how to construct the hook member 40 to apply the desired amount of preload pressure. In yet another embodiment, the hook member 40 may have a projection 42, preferably a concave dimple, formed therein for contacting the daughter surface side 24 of the planar board 22 and for applying the predetermined preload pressure against the planar board 22. When the planar board 22 is inserted into the chassis 10 (FIG. 1), the hook member 40 is received through the retaining slot 26 and the planar board is moved forward until the projection 42 contacts the daughter side surface 24 of the planar board 22.

Figure 3:
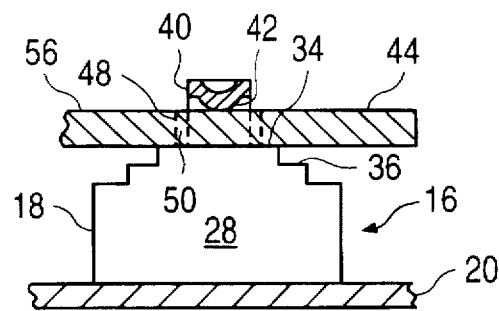
FIG. 3 illustrates a cross-sectional view of a planar mount with a planar board having a first thickness supported by a first pair of shoulders.
Figure 4:
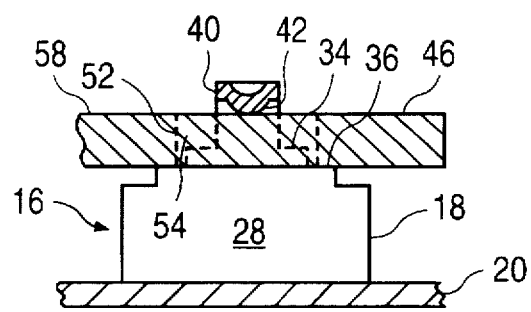
FIG. 4 illustrates a cross-sectional view of the planar mount of FIG. 3 with a planar board having a second thickness supported by a second pair of shoulders.

Turning now to FIGS. 3 and 4, there is illustrated in cross-sections, first and second planar boards 44,46 that have different thicknesses. It should be noted for clarity that the edges 48 of the retaining slot 50 in the first planar board 44 are represented by the dashed lines as indicated FIG. 3 and that the edges 52 of the retaining slot 54 in the second planar board 46 are represented by the dashed lines as indicated in FIG. 4. As illustrated in FIG. 3, the planar support 18 is coupled to the planar plate 20. While the mounting wall 14 (FIG. 1) is not illustrated in FIGS. 3 and 4, it should be understood that the mounting wall would lie immediately under the planar plate 20, which is illustrated. The first planar board 44 is supported by the first pair of shoulders 34. As seen in FIG. 3, the edges 48 of the retaining slot 50 are engaged with and supported by the first shoulder 34. The projection 42 is firmly in contact with a daughter side surface 56 of the first planar board 44 to apply the predetermined preload pressure.

As illustrated in FIG. 4, the planar support 18 is coupled to the planar plate 20, and the second planar board 46 is engaged with and supported by the second pair of shoulders 36. As seen in FIG. 4, the edges 52 of the retaining slot 54 are engaged with and supported by the second shoulder 36. The projection 42 of the second planar board 46 is firmly in contact with a daughter side surface 58 of the second planar board 46 to apply the predetermined preload pressure. It should be particularly noted that the daughter side surfaces 56,58 of the first and second planar boards 44,46, respectively are the same distance from the planar plate 20, which positions the daughter side surfaces 56,58 the same distance from the mounting wall 14 of the chassis 10 (FIG. 1). Thus, even though the thickness of the first and second planar boards 44,46 are different, the planar mount 16 of the present invention accommodates either thickness while keeping the daughter side surfaces 56,58 of the first and second planar boards 44,46 the same distance from the mounting wall 14 (FIG. 2). This unique planar mount and planar mount system thereby allow manufactures to use the same chassis for either thickness of planar board without making time consuming and expensive alterations to either the chassis or the planar mounts.

From the above description, it is apparent that the present invention provides, for use in a chassis configured to alternatively house first or second planar boards having different thicknesses and daughter board side surfaces, a universal planar mount for supporting the planar board within the chassis. In a preferred embodiment, the universal planar is a planar support coupled to a wall of the chassis that has first and second shoulders, preferably more than two, associated therewith that are preferably stair-stepped with respect to each other. Preferably, the planar support is a plurality of planar supports. In another aspect, the shoulders are formed in opposite side edges of the support walls. The first shoulder is engagable with the first planar board to mount the daughter board side surface of the first planar board a predetermined distance from the wall. Alternatively, the second shoulder is engagable with the second planar board to mount the daughter board side surface of the second planar board the same predetermined distance from the wall.

Thus, the present invention offers the distinct advantage of providing a planar mount that accommodates either a first planar board with a certain thickness or a second planar board having a thickness different from that of the first planar board while maintaining the daughter board side surfaces of either of the boards the same predetermined distance from the wall of the chassis. This allows the manufacturer to use the same chassis for either planar board without the necessity of adjusting the chassis or other components to that particular planar boards thickness. Moreover, since the planar support is coupled to the wall of the chassis, the planar supports forms an EMI path from the first or second planar boards to the chassis.

Although the present invention and its advantages have been described in detail, those skilled in the art should understand that they can make various changes, substitutions and alterations herein without departing from the spirit and scope of the invention in its broadest form.

What is claimed is:

1. A universal planar mount system, comprising:
    a computer chassis configured to alternatively house first or second planar boards having different thicknesses and daughter board side surfaces, said computer chassis having a wall for mounting a planar board thereto;
    a planar support coupled to said wall of said chassis and having first and second shoulders associated therewith, said planar support further having a first end coupled to said wall and a second end extending inwardly from said wall, said first shoulder engagable with a surface of said first planar board to mount said daughter board side surface of said first planar board a predetermined distance from said wall and said second shoulder engagable with a surface of said second planar board to mount said daughter board side surface of said second planar board said predetermined distance from said wall, said planar mount accommodating said first or second planar boards of different thickness while maintaining said daughter board side surface of said first or second planar boards at said predetermined distance; and
    a hook member coupled to said second end of said planar support and extending outwardly from and transverse to said planar support, said hook member configured to be received through a retaining slot formed in said first and second planar boards;
    wherein said shoulders are stair-stepped.

2. The planar mount system of claim 1 further comprising a planar board wherein said planar board is:
    a first planar board having a retaining slot formed therein and a support surface on opposite sides of said retaining slot, said support surfaces engaging said first shoulder to thereby support said daughter side surface of said first planar board said predetermined distance from said wall; or
    a second planar board having a retaining slot formed therein and a support surface on opposite sides of said retaining slot, said support surfaces engaging said second shoulder to thereby support said daughter side surface of said second planar board said predetermined distance from said wall.

3. The planar mount system of claim 1 wherein said hook member is configured to apply a predetermined preload pressure to said first or second planar boards.

4. The planar mount system of claim 3 wherein said hook member includes a projection formed therein for contacting said daughter board side surface of said first or second planar boards and applying said predetermined preload pressure.

5. The planar mount system of claim 1 wherein said planar support comprises a substantially flat wall member that is integrally formed with said wall of said chassis.

6. The planar mount system of claim 5 wherein said wall member is die-stamped from said wall of said chassis.

7. The planar mount system of claim 1 wherein said planar support comprises a substantially flat member integrally formed with a planar plate coupled to said wall of said chassis.

8. The planar mount system of claim 7 wherein said member is die-stamped from said planar plate.

9. The planar mount system of claim 1 wherein said planar supports form an EMI path from said first or second planar boards to said chassis.

10. The planar mount system of claim 1 wherein said shoulders are formed in opposite side edges of said planar support.

11. A universal planar mount system, comprising:
    a computer chassis configured to alternatively house first or second planar boards having different thicknesses and daughter board side surfaces, said computer chassis having a wall for mounting a planar board thereto;
    a planar support coupled to said wall of said chassis and having first and second shoulders associated therewith, said planar support further having a first end coupled to said wall and a second end extending inwardly from said wall, said first shoulder engagable with a surface of said first planar board to mount said daughter board side surface of said first planar board a predetermined distance from said wall and said second shoulder engagable with a surface of said second planar board to mount said daughter board side surface of said second planar board said predetermined distance from said wall, said planar mount accommodating said first or second planar boards of different thickness while maintaining said daughter board side surface of said first or second planar boards at said predetermined distance; and
    a hook member coupled to said second end of said planar support and extending outwardly from and transverse to said planar support, said hook member configured to be received through a retaining slot formed in said first and second planar boards;

wherein said planar support comprises a plurality of planar supports wherein each planar support has more than two shoulders associated therewith.

12. The planar mount system of claim 11 further comprising a planar board wherein said planar board is:

a first planar board having a retaining slot formed therein and a support surface on opposite sides of said retaining slot, said support surfaces engaging said first shoulder to thereby support said daughter side surface of said first planar board said predetermined distance from said wall; or a second planar board having a retaining slot formed therein and a support surface on opposite sides of said retaining slot, said support surfaces engaging said second shoulder to thereby support said daughter side surface of said second planar board said predetermined distance from said wall.

13. The planar mount system of claim 11 wherein said hook member is configured to apply a predetermined preload pressure to said first or second planar boards.

14. The planar mount system of claim 13 wherein said hook member includes a projection formed therein for contacting said daughter board side surface of said first or second planar boards and applying said predetermined preload pressure.

15. The planar mount system of claim 11 wherein said planar support comprises a substantially flat wall member that is integrally formed with said wall of said chassis.

16. The planar mount system of claim 15 wherein said wall member is die-stamped from said wall of said chassis.

17. The planar mount system of claim 11 wherein said planar support comprises a substantially flat member integrally formed with a planar plate coupled to said wall of said chassis.

18. The planar mount system of claim 17 wherein said member is die-stamped from said planar plate.

19. The planar mount system of claim 11 wherein said planar supports form an EMI path from said first or second planar boards to said chassis.

20. The planar mount system of claim 11 wherein said shoulders are stair-stepped.

21. The planar mount system of claim 11 wherein said shoulders are formed in opposite side edges of said planar support.

22. A computer system, comprising:

a planar board having at least one circuit layer, wherein said planar board is a first planar board or a second planar board having different thicknesses and daughter board side surfaces;

a computer chassis configured to alternatively house the first or the second planar boards, said computer chassis having a wall for mounting said planar board thereto;

a plurality of electronic components coupled to the planar board, wherein at least one of the plurality of electronic components is electrically coupled to the at least one circuit layer;

a planar support coupled to said wall of said chassis and having first and second shoulders associated therewith, said planar support further having a first end coupled to said wall and a second end extending inwardly from said wall, said first shoulder engagable with a surface of said first planar board to mount said daughter board side surface of said first planar board a predetermined distance from said wall and said second shoulder engagable with a surface of said second planar board to mount said daughter board side surface of said second planar board said predetermined distance from said wall, said planar mount accommodating said first or second planar boards of different thickness while maintaining said daughter board side surface of said first or second planar boards at said predetermined distance; and a hook member coupled to said second end of said planar support and extending outwardly from and transverse to said planar support, said hook member configured to be received through a retaining slot formed in said first and second planar boards;

wherein said shoulders are stair-stepped.

23. The computer system of claim 22 wherein:

the first planar board has a retaining slot formed therein and a support surface on opposite sides of said retaining slot, said support surfaces engaging said first shoulder to thereby support said daughter side surface of said first planar board said predetermined distance from said wall; or the second planar board has a retaining slot formed therein and a support surface on opposite sides of said retaining slot, said support surfaces engaging said second shoulder to thereby support said daughter side surface of said second planar board said predetermined distance from said wall.

24. The computer system of claim 22 wherein said hook member is configured to apply a predetermined preload pressure to said first or second planar boards.

25. The computer system of claim 24 wherein said hook member includes a projection formed therein for contacting said daughter board side surface of said first or second planar boards and applying said predetermined preload pressure.

26. The computer system of claim 22 wherein said planar support comprises a substantially flat wall member that is integrally formed with said wall of said chassis.

27. The computer system of claim 26 wherein said wall member is die-stamped from said wall of said chassis.

28. The computer system of claim 22 wherein said planar support comprises a substantially flat member integrally formed with a planar plate coupled to said wall of said chassis.

29. The computer system of claim 28 wherein said member is die-stamped from said planar plate.

30. The computer system of claim 22 wherein said planar supports form an EMI path from said first or second planar boards to said chassis.

31. The computer system of claim 22 wherein said shoulders are formed in opposite side edges of said planar support.

32. A computer system, comprising:

a planar board having at least one circuit layer, wherein said planar board is a first planar board or a second planar board having different thicknesses and daughter board side surfaces;

a computer chassis configured to alternatively house the first or the second planar boards, said computer chassis having a wall for mounting said planar board thereto;

a plurality of electronic components coupled to the planar board, wherein at least one of the plurality of electronic components is electrically coupled to the at least one circuit layer;

a planar support coupled to said wall of said chassis and having first and second shoulders associated therewith, said planar support further having a first end coupled to said wall and a second end extending inwardly from said wall, said first shoulder engagable with a surface of said first planar board to mount said daughter board side surface of said first planar board a predetermined distance from said wall and said second shoulder engagable with a surface of said second planar board to mount said daughter board side surface of said second planar board said predetermined distance from said wall, said planar mount accommodating said first or second planar boards of different thickness while maintaining said daughter board side surface of said first or second planar boards at said predetermined distance; and a hook member coupled to said second end of said planar support and extending outwardly from and transverse to said planar support, said hook member configured to be received through a retaining slot formed in said first and second planar boards;

wherein said planar support comprises a plurality of planar supports wherein each planar support has more than two shoulders associated therewith.

33. The computer system of claim 32 wherein:

the first planar board has a retaining slot formed therein and a support surface on opposite sides of said retaining slot, said support surfaces engaging said first shoulder to thereby support said daughter side surface of said first planar board said predetermined distance from said wall; or the second planar board has a retaining slot formed therein and a support surface on opposite sides of said retaining slot, said support surfaces engaging said second shoulder to thereby support said daughter side surface of said second planar board said predetermined distance from said wall.

34. The computer system of claim 32 wherein said hook member is configured to apply a predetermined preload pressure to said first or second planar boards.

35. The computer system of claim 34 wherein said hook member includes a projection formed therein for contacting said daughter board side surface of said first or second planar boards and applying said predetermined preload pressure.

36. The computer system of claim 32 wherein said planar support comprises a substantially flat wall member that is integrally formed with said wall of said chassis.

37. The computer system of claim 36 wherein said wall member is die-stamped from said wall of said chassis.

38. The computer system of claim 32 wherein said planar support comprises a substantially flat member integrally formed with a planar plate coupled to said wall of said chassis.

39. The computer system of claim 38 wherein said member is die-stamped from said planar plate.

40. The computer system of claim 32 wherein said planar supports form an EMI path from said first or second planar boards to said chassis.

41. The computer system of claim 32 wherein said shoulders are stair-stepped.

42. The computer system of claim 32 wherein said shoulders are formed in opposite side edges of said planar support.

* * * * *